US008759942B2

(12) United States Patent
Hoelke et al.

(10) Patent No.: US 8,759,942 B2
(45) Date of Patent: Jun. 24, 2014

(54) SEMICONDUCTOR DEVICE COMPRISING AN ISOLATION TRENCH INCLUDING SEMICONDUCTOR ISLANDS

(75) Inventors: Alexander Hoelke, Sarawak (MY); Deb Kumar Pal, Sarawak (MY); Pei Shan Chua, Sarawak (MY); Gopalakrishnan Kulathu Sankar, Sarawak (MY); Kia Yaw Kee, Sarawak (MY); Yang Hao, Sarawak (MY); Uta Kuniss, Elleben (DE)

(73) Assignee: X-FAB Semiconductor Foundries AG, Erfurt (DE)

( * ) Notice: Subject to any disclaimer, the term of this patent is extended or adjusted under 35 U.S.C. 154(b) by 0 days.

(21) Appl. No.: 13/321,867

(22) PCT Filed: May 22, 2009

(86) PCT No.: PCT/IB2009/052160
§ 371 (c)(1),
(2), (4) Date: Mar. 14, 2012

(87) PCT Pub. No.: WO2010/133923
PCT Pub. Date: Nov. 25, 2010

(65) Prior Publication Data
US 2012/0161276 A1 Jun. 28, 2012

(51) Int. Cl.
*H01L 21/70* (2006.01)
*H01L 21/76* (2006.01)
*H01L 29/40* (2006.01)
*H01L 29/861* (2006.01)

(52) U.S. Cl.
CPC .......... *H01L 29/8611* (2013.01); *H01L 29/407* (2013.01); *H01L 29/405* (2013.01)
USPC ......................................... 257/507; 438/404

(58) Field of Classification Search
USPC ......... 257/506, 507, 337, 339, 369, 338, 513, 257/335, 511, 330, 508, 544; 438/404, 224, 438/430, 202, 400
See application file for complete search history.

(56) References Cited

U.S. PATENT DOCUMENTS

| 6,429,502 B1 * | 8/2002 | Librizzi et al. ................ 257/510 |
| 7,531,875 B2 | 5/2009 | Udrea et al. |
| 2005/0130378 A1 * | 6/2005 | Huang et al. .................. 438/296 |
| 2008/0093667 A1 * | 4/2008 | Shibib et al. .................. 257/341 |
| 2008/0290366 A1 * | 11/2008 | Lerner ........................... 257/133 |
| 2009/0090992 A1 * | 4/2009 | Lerner et al. .................. 257/506 |
| 2010/0025763 A1 * | 2/2010 | Paul et al. ...................... 257/343 |

OTHER PUBLICATIONS

Lee W. Young; International Search Report; International Application No. PCT/IB2009/052160; Oct. 23, 2009; ISA/US, Commissioner for Patents.
Cecile Chatel; International Preliminary Report on Patentability; International Application No. PCT/IB2009/052160; Nov. 22, 2011; The International Bureau of WIPO.
Booth, Richard; International Preliminary Report on Patentability; Chapter II of the Patent Cooperation Treaty; International Application No. PCT/IB2009/052160; Jan. 25, 2012; IPEA/US.

* cited by examiner

*Primary Examiner* — Julio J Maldonado
*Assistant Examiner* — Moin Rahman
(74) *Attorney, Agent, or Firm* — Stevens & Showalter LLP (57) ABSTRACT

The present invention provides semiconductor devices and methods for fabricating the same, in which superior dielectric termination of drift regions is accomplished by a plurality of intersecting trenches with intermediate semiconductor islands. Thus, a deep trench arrangement can be achieved without being restricted by the overall width of the isolation structure.

19 Claims, 11 Drawing Sheets

SEMICONDUCTOR DEVICE COMPRISING AN ISOLATION TRENCH INCLUDING SEMICONDUCTOR ISLANDS

FIELD OF THE INVENTION

The present invention generally relates to the field of high voltage semiconductor devices, and more specifically to isolation structures capable of electrically isolating (blocking) high voltage devices, such as lateral high voltage devices in thick-film SOI power integrated circuit technologies.

BACKGROUND.

High voltage (HV) semiconductor devices such as diodes, transistors and IGBTs insulated gate bipolar transistors), usually include more or less heavily doped semiconductor areas so as to define a pn junction. In HV applications, which are to understood as applications requiring the handling von approximately 60 V and higher, such as 100V and more, for instance up to several hundred Volts, usually contain a dedicated pn junction, which depletes in the off-state and supports the off-state voltage, i.e., the depleted region electrically isolates the p-doped region and the n-doped region from each other. This part is called "drift region", "lowly-doped region" or "voltage supporting region". To those skilled in the art, the engineering of this drift region is well-established.

The high voltage device is embedded in a semiconductor substrate or material, which is normally held at a low voltage. For this reason high voltage semiconductor devices also contain isolation regions, which electrically isolate the device from the surrounding substrate. These isolation regions ensure that the high voltage is contained within the high voltage device and that the high voltage does not negatively impact the surrounding devices and the package.

Electrical isolation is achieved either by reverse-biased pn-junctions or by dielectric materials. Junction isolation utilizes similar lowly-doped regions as the drift region of the HV device. In order to be effective these isolation areas must have a higher voltage carrying capability than the interior device. In this way the voltage rating is given by the interior device only. For high voltages beyond about 100V large radii of curvature are required at respective "corners" of the interface between the interior device and the isolation region so as to minimize 2-dimensional (2D) and 3D effects of the electric field distribution which will otherwise limit the voltage carrying capability of the junction isolation area. Such curved sections with increased radii of curvature surrounding the HV device therefore increase the area requirement in the substrate for the HV device.

For lateral high voltage devices such as LDMOS, LIGBT, the lowly-doped drift region not only needs to be isolated from the surrounding substrate. The drift region also needs to be terminated in such a way that the carefully engineered field or potential distribution is not altered, since only this case the full voltage rating of the HV device can be realized. In junction isolation this requirement is achieved by rounded and oval portions commonly referred to as racetrack design. A disadvantage of these racetrack portions is that the required large inner radii increase the size of the core device. In particular, the pitch of lateral HV devices becomes larger than predicted from 2D considerations. Hence, great efforts are being made to improve this fundamental design requirement of junction isolation.

Another technique to isolate the device and terminate the drift region is dielectric isolation. Here, the task of isolation and drift region termination is fundamentally simpler. Vertical isolation is realized by using SOI (Silicon on Insulator) material, which contains a BOX (Buried Oxide) layer between the active top layer and the handle wafer substrate. Lateral isolation is achieved by forming oxide filled trenches or field oxide reaching all the way down to the BOX.

An efficient electric insulation can be achieved with relatively small geometries, due to the high electric field strength of common dielectric materials, such as silicon dioxide, silicon nitride and the like. Also, large radii of curvature are not strictly required as only the electric field strength needs to be considered, while 2D and 3D effects according to semiconductor device physics may be neglected due to the dielectric nature of the isolating material. Thus the area consumption of dielectric isolation and termination is small, when compared to junction isolation.

In thin-film SOI, with a thickness of the top silicon layer on the order of 1 µm or less, shallow trench isolation (STI) or local oxidation of silicon (LOCOS) is used to form the lateral isolation and termination. This form of isolation has practically no limitation on the width of the isolation structure, as shown in FIG. 1 and FIG. 2.

Figure 1:
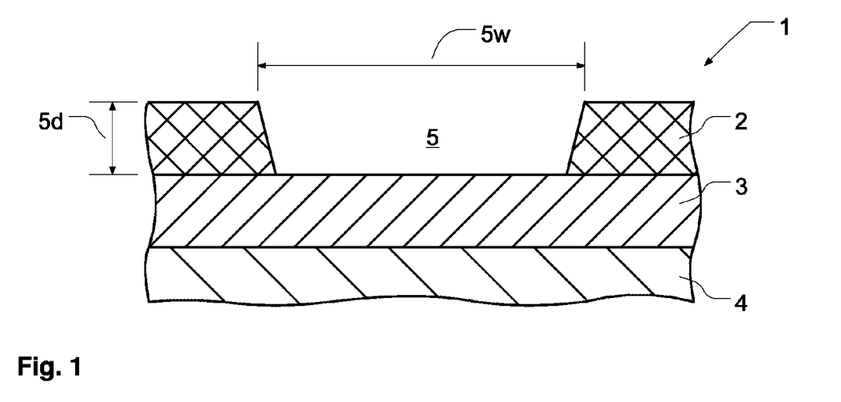
FIGS. 1 and 2 schematically illustrate cross-sectional views of a conventional semiconductor device including a shallow (STI) and wide isolation trench in different manufacturing phases, FIGS. 3 and 4 schematically illustrate cross-sectional views of a conventional semiconductor device including a deep (DTI) and narrow isolation trench in different manufacturing phases, FIG. 5 schematically illustrates a cross-sectional view of a conventional semiconductor device including a deep and wide isolation trench with a resulting non-acceptable surface topography, FIGS. 6 and 7 schematically illustrate top views of a semiconductor device representing a HV lateral PIN diode including a shallow and wide isolation trench with the resulting field distribution in the wide isolation trench (FIG. 7), FIGS. 8 and 9 schematically illustrate top views of the semiconductor device of FIGS. 5 when laterally enclosed by a narrow trench and the resulting inferior field distribution in the drift region (FIG. 9), FIGS. 10 and 11 schematically illustrate top views of a semiconductor device including a shallow and wide isolation trench and a corresponding field distribution (FIG. 11), which is difficult to achieve for a deep trench isolation regime according to conventional techniques, FIG. 12 schematically illustrates a top view of a semiconductor device including a circuit element in the form of a PIN diode, whose drift region is dielectrically terminated by an isolation structure comprising semiconductor islands according to an example of the present invention, FIGS. 13 and 14 schematically illustrate cross-sectional views of the semiconductor device of FIG. 12 along a current flow direction (FIG. 13) and along a 'width' direction of the isolation structure (FIG. 14), respectively, according to inventive embodiments, FIG. 15 schematically illustrates a cross-sectional view of the semiconductor device of FIG. 12 in a bulk configuration according to still further embodiments of the invention, and FIG. 16 schematically illustrates a top view of the semiconductor device when operated in the reverse bias mode.

FIG. 1 schematically illustrates a cross-sectional view of a semiconductor device 1 that comprises a substrate 4, for instance a handle wafer, a buried oxide layer 3 and a silicon layer 2 formed on the buried oxide layer 3. Furthermore, a trench 5 is formed in the silicon layer 2 and extends to the buried oxide layer 3. Hence, the depth 5d of the trench 5 substantially corresponds to the thickness of the silicon layer 2, when a pronounced etching into the buried oxide layer 3 has been avoided during the preceding patterning process for forming the trench 5. As discussed above, the trench 5 has also a width 5w that is appropriate for providing the desired insulating effect after being filled with a dielectric material, such as silicon dioxide. As discussed above, for a thin-film SOI architecture the width 5w of the trench 5 is typically significantly greater than the depth 5d thereof. The trench 5 can be fabricated on the basis of well-established manufacturing techniques including lithography and etch techniques for etching material of the silicon layer 2 selectively to an etch mask and the buried oxide layer 3.

Figure 2:
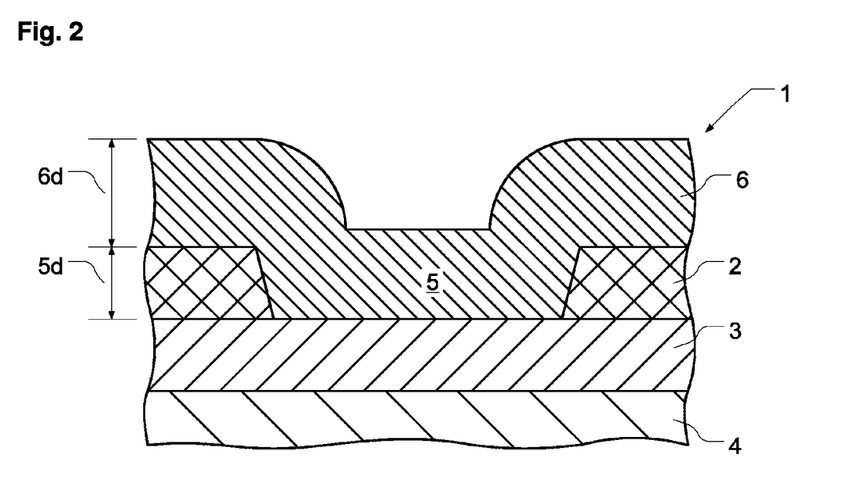

FIG. 2 schematically illustrates the device 1 at a further advanced manufacturing phase, in which the trench 5 is filled with a dielectric material 6, such as silicon dioxide. The deposition of the material 6 is accomplished by CVD (chemical vapour deposition), and the like using well-known deposition recipes. As illustrated, the material 6 can be deposited with a thickness 6d that is greater than the depth 5d of the trench 5, due to the moderately low depth 5d of the thin-film SOI configuration, thereby enabling a complete and reliable filling of the trench 5, since the filling process, at least in the centre of the trench 5, advances from bottom to top, while the growth of the material 6 from the sidewalls is less pronounced due to the small aspect ratio defined by the depth 5d to the width 5w.

Thus, by using the shallow but wide trench 5 filled with the material 6 as an isolation structure, lateral HV devices can efficiently be isolated from the surrounding material of the layer 2 and therefore can be readily implemented into a thin-film SOI technology.

On the other hand, when using deep trenches for isolation, the width of such trenches is limited to a few microns. This situation is due to the fact that filling the trenches with dielectric layers is realized by depositing such layers on the trench sidewalls, as will be explained with reference to FIGS. 3 and 4.

Figure 3:
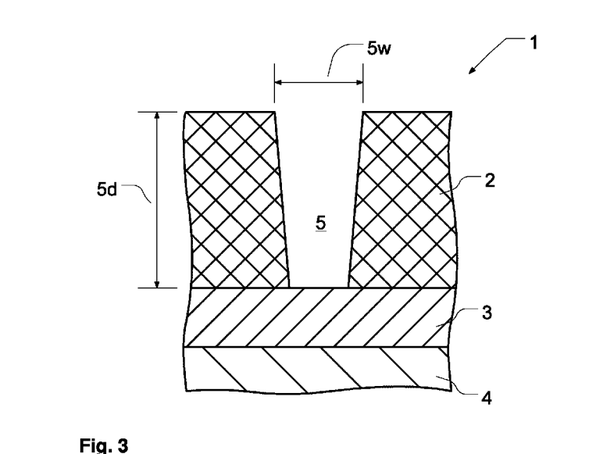

FIG. 3 schematically illustrates a cross-section view of the semiconductor device 1 according to a thick-film SOI architecture. As illustrated, the device 1 comprises the trench 5 as a deep trench due to an increased thickness of the silicon layer 2, which may range from several µm to several tens of µm. In the example shown, the width 5w is substantially smaller than the depth 5d of the trench 5 in FIG. 3 in order to enable a reliable filling of the trench 5 with a practicable thickness of a dielectric material.

Figure 4:
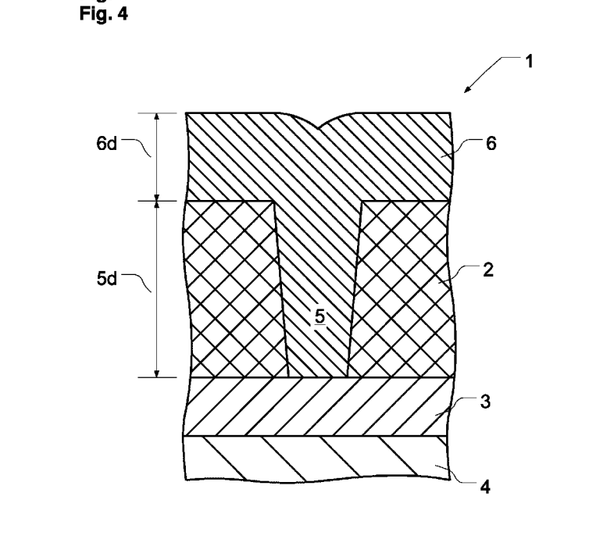

FIG. 4 schematically illustrates the device 1 according to the thick-film SOI architecture, wherein the trench 5 is filled with the dielectric material 6, which has now a thickness 6d that is at most half the width 5d. Hence, during the deposition process for forming the material 6 the trench 5 is filled from the sidewalls, thereby allowing a complete filling with the thickness 6d of the material 6 being less than the depth 5d of the trench 5. In this case, however, the width 5w is restricted to moderately small values.

As explained above with reference to FIG. 1 and FIG. 2, very wide trenches would require very thick dielectric films to fill relatively deep trenches, but this is expensive and to leads to difficulties during standard CMOS manufacturing due to stress that may be created in the dielectric material during the deposition thereof. Hence, it is very difficult to fill wide and deep trenches, unless creating a severe topography.

Figure 5:
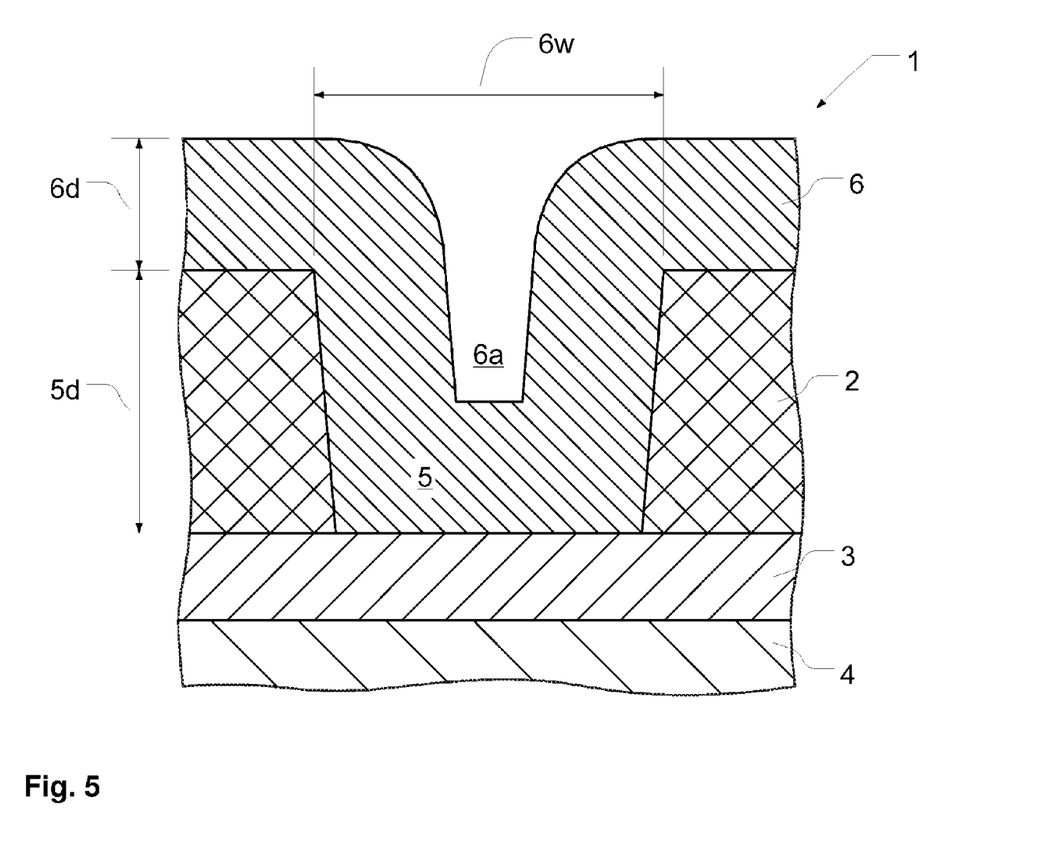

FIG. 5 schematically illustrates the device 5 when the trench 5 represents a deep and moderately wide trench. When "filling" the trench 5 with the dielectric material 6 having a thickness 6d that is similar to the thickness 6d of FIG. 4, a hole of gap 6a remains after planarization and such surfaces are very difficult to be manufactured in a standard planar semiconductor process. Thus, the width 5w of the deep trench 5 is limited to twice the dielectric layer thickness 6d at best. Again, this property of DTI (deep trench isolation) is a fundamental contrast to STI (shallow trench isolation), which fill from the bottom and thus have no width constriction, as is explained above with reference to FIG. 1 and FIG. 2.

For a purely electric HV isolation, this width limitation of a deep trench is not an issue. For example, a one micron wide oxide-filled trench can isolate several 100's of volts.

However, when using an isolation trench for the lateral termination of depleted drift regions the limited width of the trench degrades the achievable breakdown voltage. The semiconductor area outside the HV device acts as a field plate and changes the potential distribution in the drift region, as will be described with reference to FIGS. 6 to 9.

Figure 6:
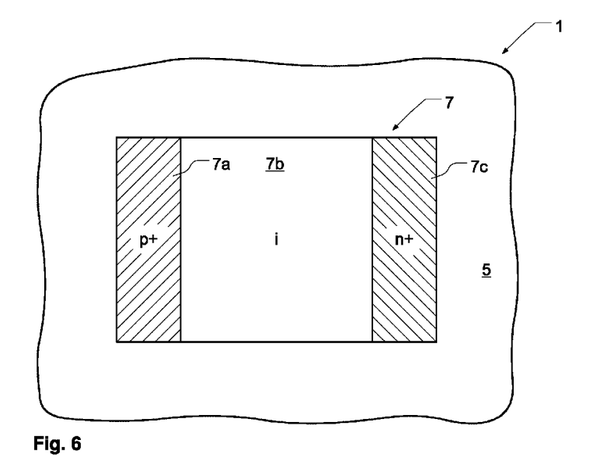

FIG. 6 schematically illustrates a top view of a conventional device 1, which comprises a HV element in the form of a PIN (p-doped, intrinsic, n-doped) diode 7, which is laterally isolated by the isolation structure 5 having wide width. Moreover, as previously discussed, the diode 7 is vertically isolated by a buried oxide layer (not shown). The diode 7 represents a HV device, i.e., a device that may be operated with voltages of 100 V and higher. The diode 7 comprises a p-doped region 7a and an n-doped region 7c each having a dopant concentration as required for obtaining the desired diode functional behaviour. Moreover, a drift region 7b is laterally positioned between the regions 7a, 7c. As discussed above, the drift region 7c typically has a lower dopant concentration compared to the regions 7a and 7c so as to allow a depleted area to form upon applying a reverse bias voltage. The depletion zone in the drift region 7b thus provides for the desired electric field strength or dielectric strength in the reverse bias mode.

Figure 7:
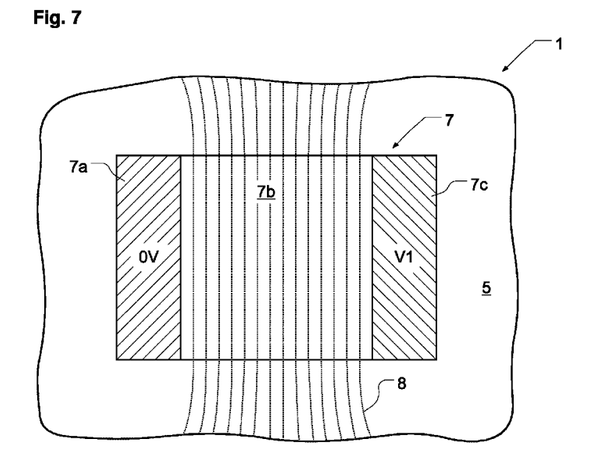

FIG. 7 schematically illustrates the device 1, when the diode 7 is operated in a reverse bias mode, wherein uniformly spaced potential lines 8 (lines of constant electric potential) allow the highest breakdown voltage V1, which is physically possible in this arrangement. That is, the isolation structure 5 is provided with a sufficiently great width so as to not affect the distribution of the potential lines 8.

Figure 8:
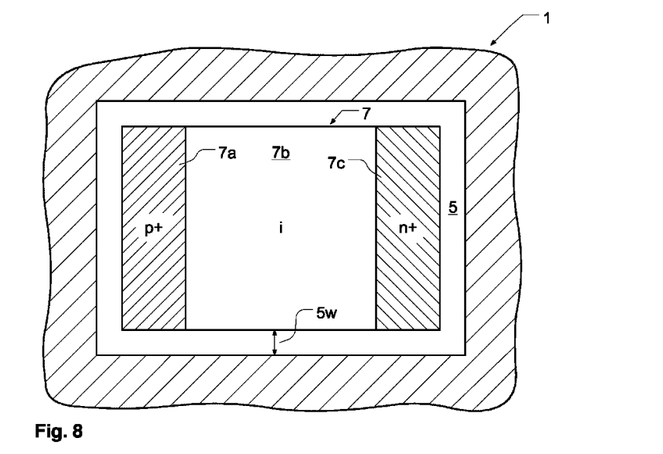

FIG. 8 depicts the device 1 when comprising the isolation structure 5 based on a reduced width 5w, i.e., the isolation structure 5 represents a narrow trench isolation that separates the device 7 from the surrounding semiconductor layer 2, which may be provided in the form of p-doped material. The doping of layer 2 is of less importance.

Figure 9:
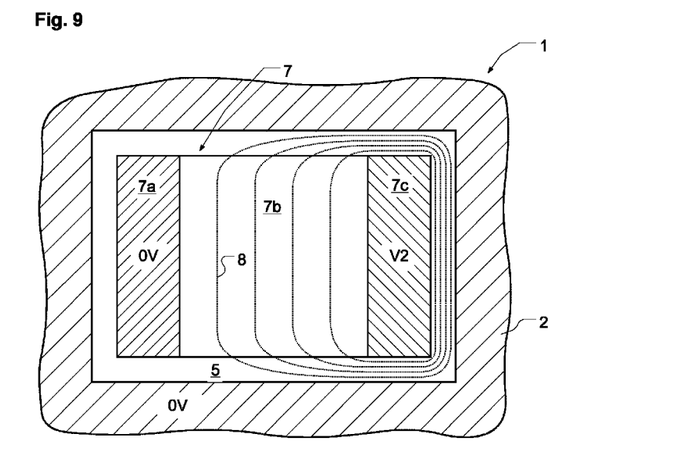

FIG. 9 shows the device 1 in the reverse bias mode, wherein the potential lines 8 crowd around the region 7c, which may be at a high yet reduce positive voltage compared to the arrangement of FIG. 7. This field crowding in the vicinity of the region 7c thus leads to a substantially smaller breakdown voltage V2 due to the increased distance of potential lines 8 in the drift region 7b in this configuration compared to the substantially non-influenced configuration described with reference to FIG. 7.

Figure 10:
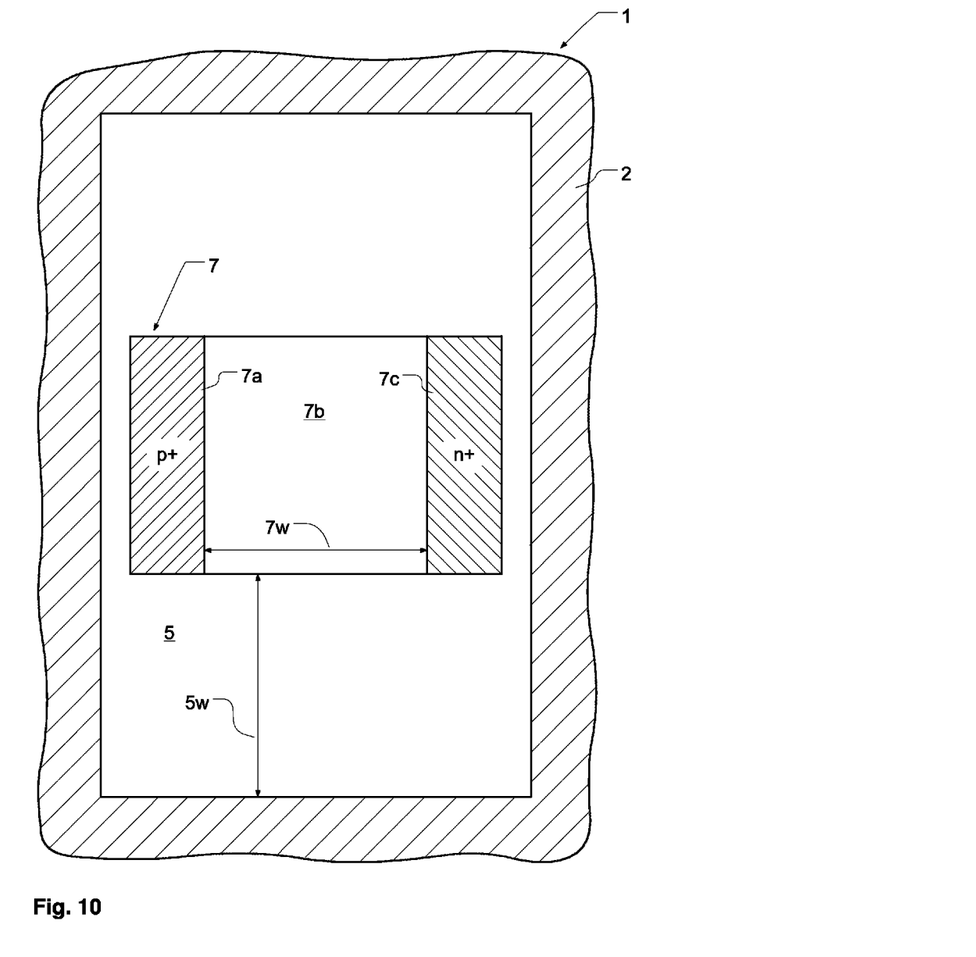

FIG. 10 schematically illustrates the device 1, wherein the trench isolation structure 5 has an increased width at least an area adjacent to the drift region 7b. In order to significantly reduce the influence of the isolation structure 5 on the finally obtained dielectric strength of the drift region 7b in the reverse bias mode, the width 5w is selected to be at least in the range or order of the drift region width 7w. In this case the potential lines are uniform in reverse bias mode and the electric field is uniform and hence, the breakdown voltage is as high as V1 in FIG. 7.

Figure 11:
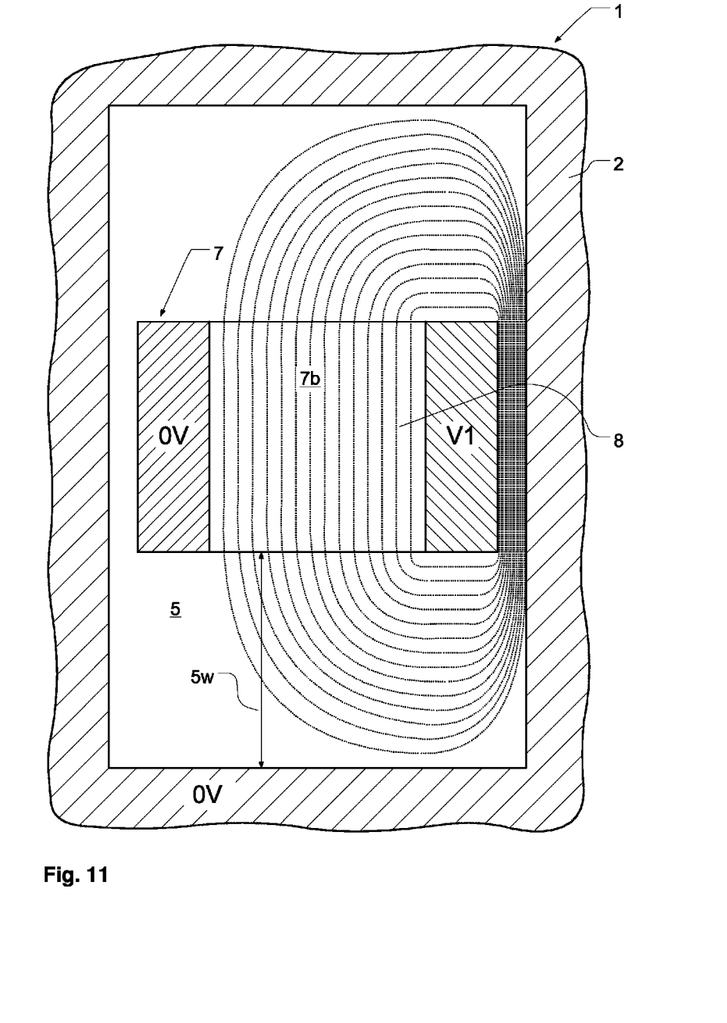

FIG. 11 illustrates the device 1 in the above described arrangement. That is, the potential lines 8 may have a substantially equal spacing within the drift region 7b and the adjacent portion of the trench isolation structure 5 having the width 5w, thereby providing for the desired high dielectric strength of the drift region 7b.

In thick SOI technologies, however, it is very difficult to terminate the drift region 7b dielectrically using deep trenches, as is shown in FIG. 11, because they can not be filled with a dielectric material without creating undesired topography or causing significant stress, as previously discussed. Hence, junction isolation is commonly used to terminate the drift region in thick-film SOI technologies and therefore, the same area penalty applies as in HV bulk technologies. Additionally, the DTI of reduced width is then used to isolate the internally junction-terminated HV device dielectrically to the substrate.

SUMMARY OF THE INVENTION

It is therefore an object of the claimed invention to provide semiconductor devices having an efficient isolation structure while avoiding one or more of the problems identified above.

Generally, the present invention provides a semiconductor device and a method of fabricating the same, wherein a dielectric termination of a semiconductor region used for accommodating a specified reverse voltage is accomplished by providing deposition conditions that are compatible with CMOS manufacturing techniques while at the same time providing an effective total width of the isolation structure that corresponds to a wide trench isolation configuration. The effective desired wide isolation width is obtained by selecting a width as required for obtaining a desired distribution of the potential lines, wherein additionally isolated semiconductor regions are maintained within the isolation structure in order to provide a geometry during the deposition of the insulating material that allows a reliable filling of the trenches with a layer thickness of the insulating material that is less than the trench depth. Hence, during the deposition of the insulating material the device geometry is similar to the situation encountered during the filling of deep narrow trenches, while on the other hand, the remaining semiconductor portions or islands do not significantly influence the overall distribution of the electric field within the isolation structure, thereby achieving the desired "wide trench" behaviour adjacent to the semiconductor region accommodating the specified reverse voltage.

It should be appreciated that a semiconductor region that is provided with an appropriate dopant concentration and size so as to provide a desired electric field strength or dielectric strength when operated in a depleted mode will also be referred to as a drift region.

According to one aspect the object is solved by a semiconductor device that comprises a first semiconductor region formed above a substrate, wherein the first semiconductor region comprising a drift region. A second semiconductor region is formed above the substrate and laterally encloses at least a portion of the first semiconductor region. The semiconductor device further comprises an isolation structure positioned laterally between at least the drift region and the second semiconductor region, wherein the isolation structure comprises a first plurality of isolation trenches filled with an insulating material and extending along a first lateral direction and being spaced apart by portions of semiconductor material having a first width along the first lateral direction. The isolation structure further comprises a second plurality of isolation trenches filled with the insulating material and extending along a second lateral direction and being spaced to apart by the portions of semiconductor material having a second width along the second lateral direction, wherein the first and second plurality of isolation trenches form a plurality of intersection areas.

Hence, the isolation structure of the semiconductor device comprises semiconductor portions embedded in the insulating material, thereby providing for an enhanced topography of the isolation structure irrespective of the lateral size and the depth thereof. Additionally, the semiconductor portions do not adversely affect the field distribution in the isolation structure and thus in the adjacent drift region.

In a further embodiment each of the first and second portions of semiconductor material is electrically insulated from the drift region so that insulating material is positioned next to and adjacent to the drift region.

In a further embodiment, for each isolation trench of the first and second pluralities of isolation trenches a depth thereof is greater than a width. Therefore, an isolation regime is established in which each of the individual isolation trenches represents a "deep trench" configuration, which may be advantageously used in applications requiring a moderately large extension of the semiconductor circuit elements along a depth direction, as is, for instance, the case in thick-film SOI architectures.

In one embodiment the depth is 1 µm or more, while in other embodiments the depth is 5 µm or more, thereby providing increased design flexibility with respect to dielectric strength and drive current capability of the circuit elements.

In a further embodiment the semiconductor circuit element further comprises a p-doped region and an n-doped region that are laterally separated by the drift region. Hence, any circuit elements may be formed that require a specified electric field strength of the drift region when inversely biased, wherein the electric field strength can be adjusted in a space-efficient manner within a wide range. The field strength is considered a synonym for dielectric strength.

In one illustrative embodiment the drift region has a first lateral dimension oriented along a current flow direction between the p-doped region and the n-doped region, wherein the isolation structure has a width along a lateral direction perpendicular to the current flow direction and wherein the width is at least 0.5, preferably about 0.8 to 1.2 times the first lateral dimension. Consequently, the isolation structure may dielectrically terminate the drift region such that the distance between equidistant potential lines in to the drift region and isolation structure is comparable, thereby suppressing or at least reducing any undue modification of the dielectric strength of the drift region.

In further embodiments the semiconductor circuit element is one of a diode structure, a field effect transistor a bipolar transistor and an insulated gate bipolar transistor. Thus, the power circuit elements for many applications may be provided by using the enhanced isolation structure.

In a further preferred embodiment the portions of semiconductor material form a regular array. Hence, the distribution of the potential lines may appropriately be adjusted by selecting the size and configuration of the array, which is to be understood as a two-dimensional array that comprises individual and separated array elements along two linearly independent lateral directions. For example, if the semiconductor portions, i.e., the array elements are electrically floating, a substantially non-disturbed field distribution may be obtained by selecting the size and position of the semiconductor portions in an appropriate manner within the regular array while also not exceeding a specified "maximum" distance between adjacent two of the array elements in order to provide the superior deposition geometry during the deposition of the insulating material into the array of semiconductor portions. Some or all of the array elements may be connected to one or more specific reference potentials, thereby allowing a specific patterning of the field distribution in the isolation structure based on the configuration of the array.

In a further embodiment the first and second widths of the portions of semiconductor material are formed on the basis of the same design width. That is, the first and second widths are equal to each other except for process induced variations. For example, the portions of semiconductor material are provided in the form of square-like "islands" within the insulating material of the isolation structure.

In one preferred embodiment the semiconductor device further comprises a buried insulating layer formed below the first and second semiconductor regions to define an SOI configuration. Hence, sophisticated SOI devices including HV devices, such as thick-film SOI architectures, having a thickness of the first and second semiconductor regions of 1 µm or more, and thin-film SOI architectures, having a thickness of the first and second semiconductor regions of less than 1 µm, may efficiently be realized with increased design flexibility and reduced area penalty compared to conventional techniques as described above.

In another embodiment the first and second pluralities of isolation trenches extend to the buried insulating layer. In this manner, the intermediate portions of semiconductor material are electrically isolated from each other, so that the field distribution remains substantially non-affected by the portions of semiconductor material.

The trenches may terminate in semiconductor material, for instance above a buried insulating layer or in the substrate material of a bulk configuration.

According to another aspect of the present invention the object is solved by a method of forming a semiconductor device. The method comprises a step of forming a plurality of intersecting trenches in a semiconductor layer adjacent to a drift region of a semiconductor circuit element. Additionally, the plurality of intersecting trenches is filled with a dielectric material to form an isolation structure laterally separating the drift region from semiconductor material.

Due to the plurality of intersecting trenches intermediate semiconductor material is preserved during the patterning of the trenches so that enhanced conditions during the filling in of dielectric material are achieved.

In a further embodiment the plurality of intersecting trenches is formed so as to extend to a buried insulating layer located below said semiconductor layer.

In another embodiment the plurality of intersecting trenches is formed so as to form electrically isolated portions of the semiconductor layer, each of which is electrically isolated from the drift region.

In one illustrative embodiment the method further comprises: forming the drift region so as to provide a depletion zone for accommodating a reverse bias voltage of 100 V or higher. Hence, HV voltage circuit elements, such as diodes, transistors, IGBTs, and the like may be fabricated by using the inventive concept.

Preferably, forming the isolation structure comprises: selecting a target lateral dimension of the isolation structure along a direction perpendicular to a current flow direction in the drift region, wherein the target lateral direction corresponds to a length of a depletion zone forming along the current flow direction when applying a rated reverse bias voltage.

In this way, the effective size of the isolation structure may efficiently adapted to the drift length provided by the drift region when operated in the reverse bias mode.

In a further embodiment the plurality of intersecting trenches comprises first trenches that are oriented perpendicular to second trenches, thereby providing for an efficient overall layout of the isolation structure.

In a further embodiment a spacing between adjacent two of the first plurality of isolation trenches is selected to be equal to a spacing between adjacent two of the second plurality of isolation trenches, thereby obtaining a regular array of intermediate portions of semiconductor material.

In one embodiment the step of filling the plurality of intersecting isolation trenches comprises: depositing a dielectric material with a layer thickness that is less than a depth of each of the plurality of intersecting isolation trenches. Thus, a "deep trench" arrangement is obtained for each of the intersecting isolation trenches, while at the same time a desired effective large width of the isolation structure as a whole is achieved.

The present invention thus allows the dielectric side termination of the drift region of high voltage devices with deep trench isolation (DTI). The advantage is a reduced area requirement for HV devices in thick-film SOI technologies, comparable to that of thin-film SOI technologies. Other advantages are simple design and flexibility with regard to voltage rating of the devices.

BRIEF DESCRIPTION OF THE DRAWINGS

Further embodiments are described in the following detailed description, wherein reference is made to accompanying drawings, in which like or similar features are denoted by the same reference numerals and in which.

DETAILED DESCRIPTION OF EMBODIMENTS

With reference to FIGS. 12 to 16 further embodiments of the present invention will now be described, wherein also reference is made to FIGS. 1 to 11, if required. It should be appreciated that throughout the figures similar or like features are denoted by the same reference numerals, irrespective of whether theses features correspond to conventional semiconductor devices or to semiconductor devices according to the present invention. Moreover, any positional statements in the description or the claims are to be understood as 'relative' position information based on an appropriate reference, such as the substrate surface of the carrier material of the semiconductor device. Hence, a lateral direction is to be considered as a direction parallel to the reference plane, while a depth direction or a vertical direction is a direction that is perpendicular to the lateral directions.

Figure 12:
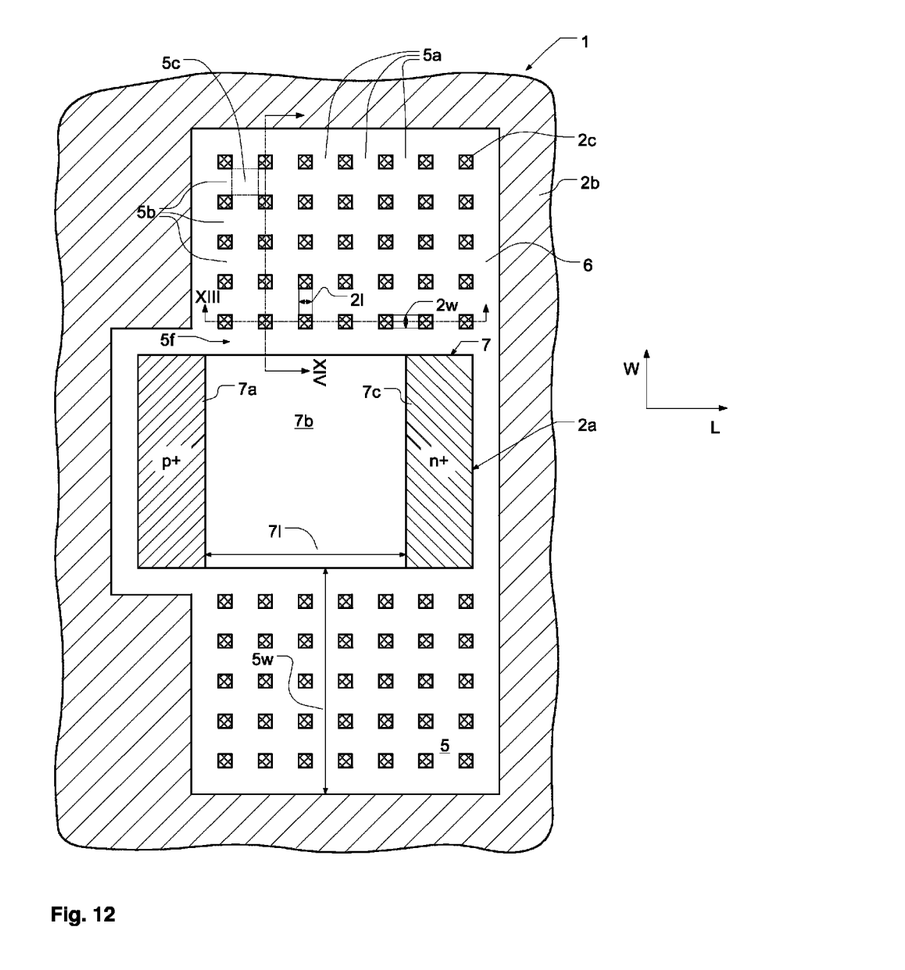

FIG. 12 illustrates a top view of a semiconductor device 1 comprising a first semiconductor region 2a in and above which is formed a semiconductor circuit element 7, such as a diode, a field effect transistor, an IGBT, and the like. In the embodiment shown the circuit element represents a diode that is designed for HV applications, i.e., for voltages of approximately 100 V and higher. The circuit element 7 comprises a drift region 7b, which connects, along a current flow direction indicated as L, at one end to a p-doped region 7a and at the other end to an n-doped region 7c. As previously discussed with reference to FIGS. 1 to 11, the drift region 7b is appropriately configured with respect to dopant profile and size so as to provide a desired high electric field strength (or: dielectric strength) when operated in the reverse bias mode. Furthermore, the device 1 comprises a second semiconductor region 2b, which is laterally isolated from the first semiconductor region 2a and thus from the circuit element 7 by an isolation structure 5. The isolation structure 5 connects to the drift region 7b and has an effective width 5w along a lateral direction W that is perpendicular to the direction L. The width 5w is selected such that a desired field distribution is achieved that may be compatible with the "dielectric requirements" (HV-requirements) of the drift region 7b, as is also discussed above. In the embodiment shown the width 5w is selected so as to be comparable to a "length" 7l of the drift region, thereby insuring a reduced modification of the field distribution in the drift region 7b in the reverse bias mode. For example, the width 5w is selected to be about 0.5, or preferably 0.8 to 1.2 times the length 7b. The width 5w may be selected, however, in any other manner as demanded by the design to requirements, wherein advantageously the width 5w and a depth of the isolation structure may be selected independently from each other without causing an undue topography. For this purpose, the isolation structure 5 comprises a plurality of at least laterally isolated portions or islands 2c of semiconductor material, which can be considered as a spacing between a plurality of intersecting isolation trenches 5a, 5b. is For example, the trenches 5a represent a plurality of trenches extending along the lateral direction W, while the trenches 5b extend along the direction L and intersect the trenches 5a at respective intersect areas 5c. Thus, the width of the individual trenches 5a, 5b may be selected so as to comply with the gap fill capabilities of a deposition process used to fill the isolation structure 5 with a dielectric material 6, such as silicon dioxide, silicon nitride, and the like. Moreover, a first trench 5f of the trenches 5b is positioned immediately adjacent to the drift region 7b, thereby avoiding a direct contact of any of the islands 2c with the drift region 7b. In the embodiment shown, the trenches 5a, 5b and thus the portions or islands 2c define a regular array, which may thus efficiently be used for adjusting the field distribution in the isolation structure 5 in a precise and predictable manner. Furthermore, in the embodiment of FIG. 12, the portions 2c have substantially the same width along the lateral directions L, W, that is, a width 21 may be equal to a width 21, except for any process related variations.

Figure 13:
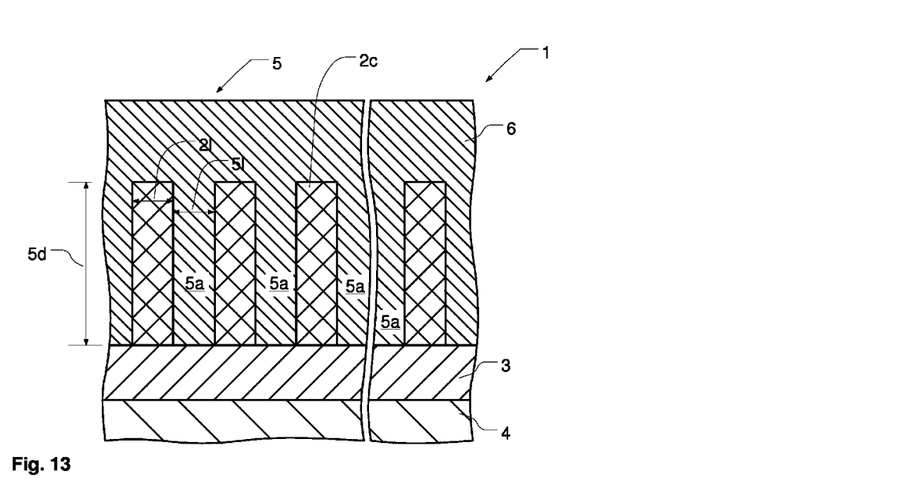

FIG. 13 schematically illustrates a section along the line XIII of FIG. 12. As illustrated, the device 1 comprises a substrate 4 and a buried insulating layer 3, such as an oxide layer, on which are formed the portions 2c and the dielectric material 6. In the manufacturing stage shown, the material of the layer 6 may still be formed so as to extend above the portions 2c, wherein any excess material can be removed in a later stage, for instance, by CMP (chemical mechanical polishing), etching, and the like. Moreover, a depth 5d of the isolation structure 5, i.e., a depth of trenches 5a, is, in this embodiment, greater than a width 5l of the trenches and also greater than the width 2l of the portions 2c. Hence, in this case for each of the individual trenches 5a a "deep trench" configuration can be established without creating a pronounced surface topography, for instance due to any holes or gaps, as is previously discussed with reference to FIG. 5.

Figure 14:
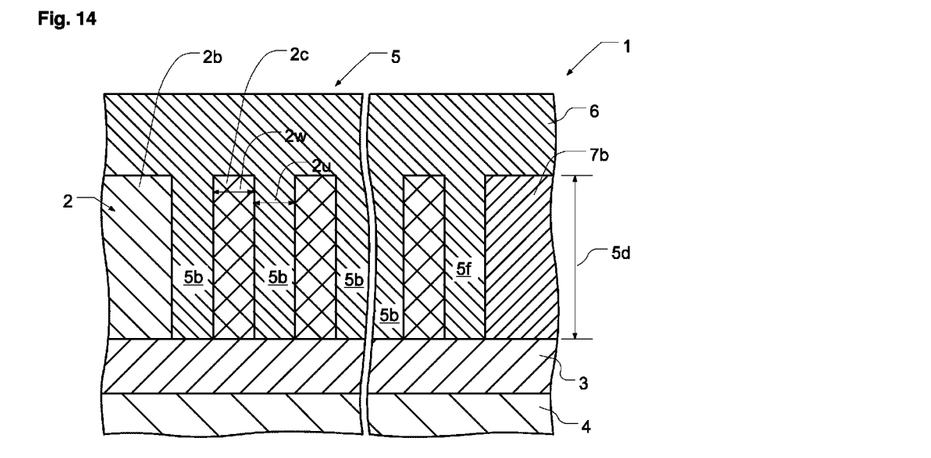

FIG. 14 schematically illustrates a section along the line XIV of FIG. 12. As illustrated, the trenches 5b have a width 5u and the depth 5d, wherein the width 5u and also the width 2w of the portions 2c are less than the depth 5d, thereby also providing for a "deep trench" configuration for the trenches 5b. Moreover, the first trench 5f provides for the lateral isolation of the portions 2c from the drift region 7b, as also previously explained. It should be appreciated that the lateral dimensions 5u, 5l may be different, if considered appropriate for the overall field distribution in the isolation structure 5.

The semiconductor device 1 may be fabricated on the basis of well-established process techniques, such as CMOS manufacturing strategies. That is, prior to or after defining an active area for the circuit element 7, an etch process may be performed on the basis of an etch mask that is formed by using a lithography mask including a pattern which corresponds to the desired configuration of the trenches 5a, 5b. Thus, the lithography process creates an etch mask that defines the width 5u, 5l of the trenches as well as the number thereof, so that the total width 5w of the isolation structure is obtained. Furthermore, the overall lateral shape of the isolation structure 5 is defined so as to correspond to the desired lateral size of the circuit element 7 and of the second semiconductor region 2b. For example, the portion of the isolation structure 5 having the width 5w may not necessarily extend along the entire length of the circuit element 7 along the direction L, but only the first trench 5f may be the non-critical region 7a, or at least a significant portion thereof.

After etching the trenches 5a, 5b into the semiconductor material 2 down to a specified depth, for instance down to the buried insulating layer 3, when an SOI configuration is considered, thereby forming the first and second semiconductor regions 2a, 2b, the trenches 5a, 5b are filled with the insulating material 6. During the deposition process the portions 2c provide for a device geometry that results in a fill behaviour as is previously described with reference to FIG. 4. Consequently, deposition techniques, such as CVD, may be applied that are compatible with the entire manufacturing flow, since any undue topography that would unduly affect the further processing is avoided while also the required thickness of the material 6 is moderately small, as discussed with reference to FIG. 4. Thereafter excess material may be removed and the further processing may be continued by forming the circuit element 7, for instance by incorporating the dopant species for the regions 7a and 7c, or forming gate electrode structures for field effect transistors and IGBTs, and the like.

Figure 15:
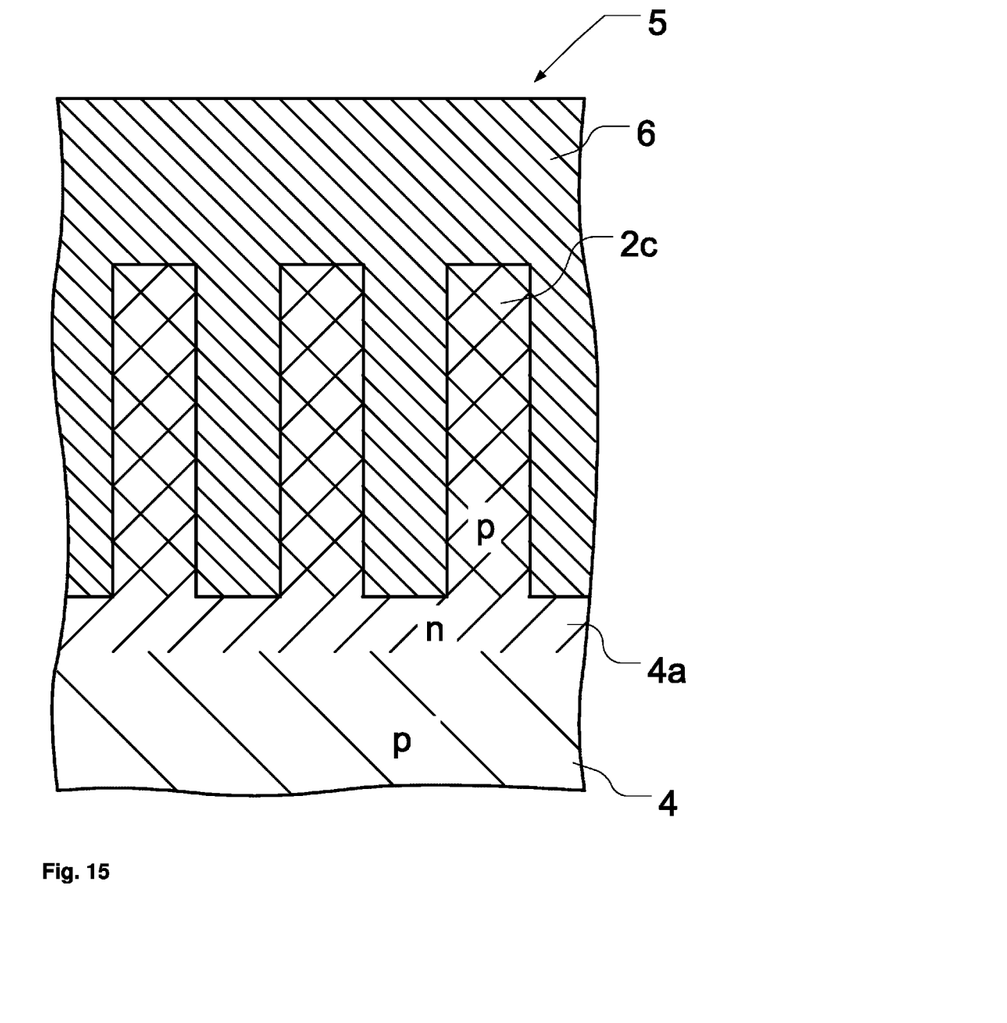

FIG. 15 schematically illustrates a cross-sectional view of the device 1 according to an embodiment, in which a bulk configuration is used in combination with the isolation structure 5. As illustrated, the substrate 4 represents a semiconductor material, such as silicon, and the portions 2c are formed in the substrate 4 so as to extend to a desired depth. In this case at least some of the portions 2c may electrically be connected via the substrate 4, while in other embodiments a vertical isolation may be achieved by providing an "isolation" layer 4a that is in contact with the portions 2c. For example, the isolation layer 4a represents a doped material layer of the substrate 4 so as to obtain a junction isolation between the remaining substrate 4 and the portions 2c. In other to embodiments the layer 4a may isolate some of the portions 2c while other portions 2c are in contact with the substrate 4, thereby enabling enhanced flexibility of adjusting the overall field distribution within the isolation structure 5 and thus within the drift region 7b.

Figure 16:
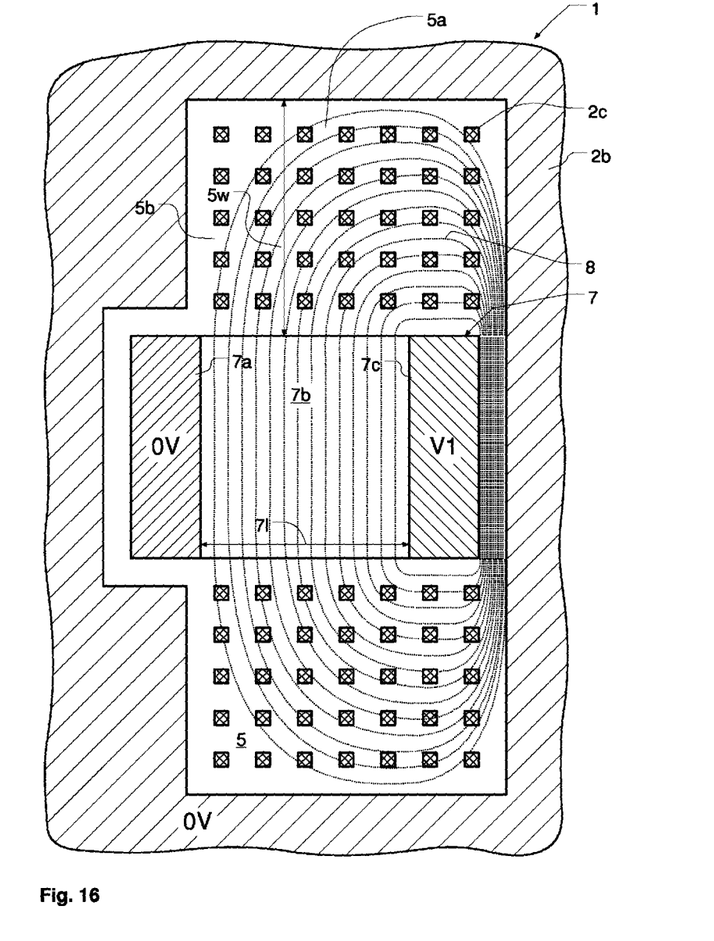

FIG. 16 schematically illustrates the device of FIG. 12, when operated in the reverse bias mode. In the reverse bias mode a positive voltage V1 is applied to the region 7c, while the region 7a and the second semiconductor region 2b are held at 0 V. Since the width 5w is appropriately adapted to the length 7l of the drift region 7b the potential lines 8 may substantially not be distorted at the sides of the drift region 7b that is terminated by the isolation structure 5. The deep trenches 5a, 5b are arranged in a matrix, such that the small semiconductor islands 2c remain as, thereby effectively forming a wide dielectric region compatible with DTI process technology, i.e. the trenches 5a, 5b are completely filled with the dielectric film 6. On the other hand this matrix of deep trenches 5a, 5b behaves electrically like a single wide trench. The semiconductor islands 2c do substantially not disturb the potential distribution because, in this embodiment, they are electrically floating. In this case, the potential distribution in the drift region 7b is uniform and the reverse bias reaches the breakdown voltage V1 of an ideal HV diode.

Hence, a scalable and simplified HV termination for drift regions is obtained. This provides real area savings compared to conventional strategies. Furthermore, the present invention is applicable to any SOI technique and also to bulk architectures.

What is claimed is:

1. A semiconductor device comprising:
a first semiconductor region formed above a substrate, said first semiconductor region comprising a drift region;
a second semiconductor region formed above said substrate and laterally enclosing at least a portion of said first semiconductor region; and
an isolation structure positioned laterally between at least said drift region and said second semiconductor region, said isolation structure terminating at least said drift region and electrically insulating said second semiconductor region from said first semiconductor region, said isolation structure comprising:
a first plurality of isolation trenches filled with an insulating material and extending along a first lateral direction and being spaced apart by portions of semiconductor material having a first width,
said isolation structure further comprising a second plurality of isolation trenches filled with said insulating material and extending along a second lateral direction and being spaced apart by said portions of semiconductor material having a second width, and
said first and second plurality of isolation trenches forming a plurality of intersection areas, wherein each of said portions of semiconductor material is electrically insulated from said drift region and said first and second pluralities of isolation trenches extend to a buried insulating layer whereby said portions of semiconductor material define an array of islands for adjusting a field distribution in said isolation structure of said pluralities of isolation trenches across said first and second lateral directions.

2. The semiconductor device of claim 1, wherein for each isolation trench of said first and second pluralities of isolation trenches a depth thereof is greater than a width.

3. The semiconductor device of claim 2, wherein said depth is 1 μm or more.

4. The semiconductor device of claim 3, wherein said depth is 5 μm or more.

5. The semiconductor device of claim 1, wherein said first semiconductor region comprises a p-doped region and an n-doped region that are laterally separated by said drift region.

6. The semiconductor device of claim 5, wherein said drift region has a first lateral dimension oriented along a current flow direction between said p-doped region and said n-doped region and wherein said isolation structure has a width along a lateral direction perpendicular to said current flow direction with said width being at least 0.5 times said first lateral dimension.

7. The semiconductor device of claim 1, wherein said first semiconductor region is one of a diode structure, a field effect transistor, a bipolar transistor and an insulated gate bipolar transistor or a thyristor, or any other gate controllable or blockable HV device.

8. The semiconductor device of claim 1, wherein the portions of semiconductor material define a regular array of islands.

9. The semiconductor device of claim 8, wherein a first lateral dimension and a second lateral dimension of said islands of semiconductor material are formed on the basis of the same design dimension.

10. The semiconductor device of claim 1, further comprising the buried insulating layer formed below said first and second semiconductor regions to define an SOI configuration.

11. A method of forming a semiconductor device, the method comprising the following steps:
forming a first semiconductor region formed above a substrate, said first semiconductor region comprising a drift region;
forming a second semiconductor region formed above said substrate and laterally enclosing at least a portion of said first semiconductor region; and
forming an isolation structure positioned laterally between at least said drift region and said second semiconductor region, said isolation structure terminating at least said drift region and electrically insulating said second semiconductor region from said first semiconductor region, said isolation structure comprising:
a first plurality of isolation trenches filled with an insulating material and extending along a first lateral direction and being spaced apart by portions of semiconductor material having a first width,
said isolation structure further comprising a second plurality of isolation trenches filled with said insulating material and extending along a second lateral direction and being spaced apart by said portions of semiconductor material having a second width, and
said first and second plurality of isolation trenches forming a plurality of intersection areas, wherein each of said portions of semiconductor material is electrically insulated from said drift region and said first and second pluralities of isolation trenches extend to a buried insulating layer whereby said portions of semiconductor material define an array of islands for adjusting a field distribution in said isolation structure of said pluralities of isolation trenches across said first and second lateral directions.

12. The method of claim 11, wherein said plurality of intersection areas are formed so as to extend to said buried insulating layer located below a semiconductor layer.

13. The method of claim 11, wherein said plurality of intersection areas is formed so as to form electrically isolated portions of a semiconductor layer, each of which is electrically isolated from said drift region.

14. The method of claim 11, further comprising: forming said drift region so as to be capable to cause a voltage drop of at least 50 V.

15. The method of claim 11, wherein forming said isolation structure comprises: selecting a target lateral dimension of said isolation structure along a direction perpendicular to a current flow direction in said drift region, wherein said target lateral direction corresponds to a length of said drift region along said current flow direction.

16. The method of claim 11, wherein forming said plurality of intersection areas comprises: forming said first plurality of isolation trenches so as to extend along the first lateral direction and forming said second plurality of isolation trenches so as to extend along the second lateral direction wherein said second lateral direction is perpendicular to said first lateral direction.

17. The method of claim 16, wherein the spacing between adjacent two of said first plurality of isolation trenches is selected to be equal to the spacing between adjacent two of said second plurality of isolation trenches.

18. The method of claim 11, wherein said first and second pluralities of isolation trenches are filled with insulating material by depositing a dielectric material with a layer thickness that is less than a depth of each of said first and second pluralities of isolation trenches.

19. The method of claim 11, wherein:
  said plurality of intersection areas are formed in a semiconductor layer adjacent to the drift region; and
  said first and second pluralities of isolation trenches are filled with a dielectric material thereby forming the isolation structure laterally separating said drift region from said second semiconductor region.

\* \* \* \* \*